(12) United States Patent
Yang et al.

(10) Patent No.: US 9,779,838 B2
(45) Date of Patent: Oct. 3, 2017

(54) METHOD OF IMPROVING ERROR CHECKING AND CORRECTION PERFORMANCE OF MEMORY

(71) Applicant: RESEARCH & BUSINESS FOUNDATION SUNGKYUNKWAN UNIVERSITY, Suwon-si (KR)

(72) Inventors: Joon-Sung Yang, Seongnam-si (KR); Hyunseung Han, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 40 days.

(21) Appl. No.: 14/839,223

(22) Filed: Aug. 28, 2015

(65) Prior Publication Data

US 2016/0062860 A1 Mar. 3, 2016

(30) Foreign Application Priority Data

Aug. 28, 2014 (KR) .................. 10-2014-0113454

(51) Int. Cl.
G11C 29/00 (2006.01)
G11C 29/52 (2006.01)
(Continued)

(52) U.S. Cl.
CPC .......... *G11C 29/52* (2013.01); *G06F 11/1048* (2013.01); *G11C 29/4401* (2013.01); *G11C 29/76* (2013.01); *G11C 15/00* (2013.01)

(58) Field of Classification Search
CPC .. G06F 11/2094; G06F 11/1068; G11C 29/52; G11C 29/4401; G11C 29/76; G11C 15/00
See application file for complete search history.

(56) References Cited

U.S. PATENT DOCUMENTS

2001/0048625 A1* 12/2001 Patti .................... G06F 11/1008 365/201
2008/0163031 A1* 7/2008 Hsieh .................. G06F 11/1068 714/773
(Continued)

FOREIGN PATENT DOCUMENTS

KR 10-2007-0072228 A 7/2007
KR 10-2008-0110710 A 12/2008
KR 10-2014-0000454 A 1/2014

*Primary Examiner* — Thien D Nguyen
(74) *Attorney, Agent, or Firm* — NSIP Law (57) ABSTRACT

A method of improving an error checking and correction performance of a memory includes replacing a defective column including a defective memory cell of the memory cell array with a spare column of a the spare cell array, wherein the memory cell array includes memory cells in a matrix and the spare cell array includes spare memory cells in a matrix to be replaced for defective memory cells; storing check bits of error correction code in at least one memory cell of the defective column; storing defect information regarding a defect of the defective memory cell; determining whether the at least one memory cell storing the check bits is to be used to perform error checking and correction on a memory, based on the defect information; and performing error checking and correction on the memory using a memory cell selected based on a result of determining whether the at least one memory cell storing the check bits is to be used.

16 Claims, 5 Drawing Sheets

(51) Int. Cl.
    *G11C 29/44*     (2006.01)
    *G06F 11/10*     (2006.01)
    *G11C 15/00*     (2006.01)

(56) References Cited

U.S. PATENT DOCUMENTS

| | | | | |
|---|---|---|---|---|
| 2008/0209282 A1* | 8/2008 | Lee | ............ | G11C 11/5621 714/54 |
| 2010/0064186 A1* | 3/2010 | Houg | ............ | G11C 29/76 714/711 |
| 2011/0060888 A1* | 3/2011 | Keeth | ............ | G11C 5/02 711/209 |
| 2011/0119560 A1* | 5/2011 | Lee | ............ | G06F 11/1068 714/758 |
| 2011/0199828 A1* | 8/2011 | Kim | ............ | G11C 16/0483 365/185.17 |
| 2012/0096307 A1* | 4/2012 | Houg | ............ | G11C 29/76 714/6.3 |
| 2013/0329510 A1* | 12/2013 | Keeth | ............ | G11C 5/02 365/200 |
| 2015/0143188 A1* | 5/2015 | Huang | ............ | G11C 29/30 714/723 |

\* cited by examiner

METHOD OF IMPROVING ERROR CHECKING AND CORRECTION PERFORMANCE OF MEMORY

CROSS-REFERENCE TO RELATED APPLICATION

This application claims the benefit under 35 USC 119(a) of Korean Patent Application No. 10-2014-0113454, filed on Aug. 28, 2014, the entire disclosure of which is incorporated herein by reference for all purposes.

BACKGROUND

1. Field of the Invention

The present invention relates to a memory, and more particularly, to a method of improving an error checking and correction performance of a memory.

2. Discussion of Related Art

As an integration degree of memory becomes higher, a rate of soft errors becomes increased. To solve this problem, high importance has been placed on error correction code (ECC) memories. Soft errors may occur due to electromagnetic interference, static electricity, cosmic rays, etc. Error checking and correction is performed on a memory using error correction code.

To fix an error occurring in a memory, it is necessary to perform error checking and correction, and error correction code for a memory, such as SEC-DED code and SEC-DED-DAEC code, has become an indispensable part for designing a memory.

As integration degrees of memories become higher, a rate of defects occurring in a process becomes increased. In general, spare rows or spare columns are used to fix defective memory cells included in a memory cell array.

Figure 1A:
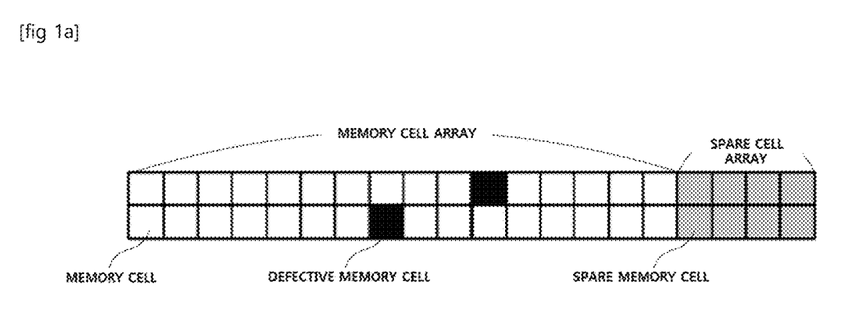
FIGS. 1A and 1B are diagrams illustrating a method of replacing a defective column having a defective memory cell of a memory cell array with a spare column of a spare cell array according to the related art.
Figure 1B:
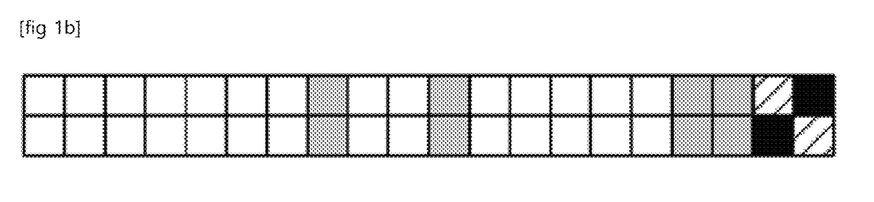

FIGS. 1A and 1B are diagrams illustrating a method of replacing a defective column having a defective memory cell of a memory cell array with a spare column of a spare cell array according to the related art.

In FIGS. 1A and 1B, the memory cell array has a 16×2 matrix structure and the spare cell array has a 4×2 matrix structure.

Referring to FIG. 1A, an eleventh memory cell in a first row of the memory cell array and an eighth memory cell in a second row of the memory cell array are defective memory cells and are thus displayed in black. Non-defective memory cells are displayed in white. Spare memory cells of the spare cell array are displayed in gray.

Referring to FIG. 1B, a defective column including the defective memory cell of the first row of the memory cell array is replaced with a fourth spare column of the spare cell array in a row direction, and a defective column including the defective memory cell of the second row of the memory cell array is replaced with a third spare column of the spare cell array in the row direction. In this case, memory cells marked with oblique lines mean memory cells that are neglected to be not used after they are replaced for the defective memory cells. When a defective column is replaced with a spare column, the defective column is neglected to be unavailable. Although memory cells that may operate normally are present in the defective column, the memory cells are not used in relation to memory operations. Thus, a method of replacing a defective column with a spare column according to the related art has a problem that normal memory cells included in the defective column cannot be used.

SUMMARY OF THE INVENTION

The present invention is directed to a method of improving an error checking and correction (ECC) performance of a memory by storing additional check bits of error correction code in at least one memory cell of a spare column that is not used to replace a defective column and the defective column, and using the at least one memory cell storing the check bits.

According to an aspect of the present invention, a method of improving an error checking and correction performance of a memory includes replacing a defective column including a defective memory cell of a memory cell array with a spare column of a spare cell array, wherein the memory cell array includes memory cells in a matrix, and the spare cell array includes spare memory cells in a matrix to be replaced for defective memory cells; storing check bits of error correction code in at least one memory cell of at least one of a spare column that is not used to replace the defective column and the defective column; storing defect information regarding the defective memory cell; selecting whether the at least one memory cell storing the check bits is to be used to perform error checking and correction on a memory, based on the defect information; and performing error checking and correction on the memory using a memory cell selected based on a result of selecting whether the at least one memory cell storing the check bits is to be used.

Error checking and correction means a method of checking and correcting an error in data using error correction code. In general, the checking of an error in data may be performed in a wider range than the correcting of an error.

The error correction code may be, but is not limited to, single-error-correcting (SEC)-double-error-detecting (DED) code or SEC-DED-double-adjacent-error-correcting (DAEC) code which is a linear block code.

In one embodiment, the storing of the defect information may include storing the defect information in an information storing spare column which is not used to replace the defective column among spare columns of the spare cell array. The information storing spare column may be one of the spare columns of the spare cell array.

The defect information may be recorded during a reset process or a booting process performed by firmware or built-in self-repair (BISR) logic.

In one embodiment, the defect information may be information regarding a location of the defective memory cell in the defective column. The information regarding the location of the defective memory cell may be information regarding the location of the defective memory cell in a defective row or column of the spare cell array after the defective column is replaced with the spare column.

In one embodiment, the storing of the defect information in the information storing spare column may include storing '1' in a spare memory cell of the information storing spare column arranged in a row in which the defective memory cell is present, when the defective memory cell is present, and storing '0' in a spare memory cell of the information storing spare column arranged in a row in which the defective memory cell is not present, when the defective memory cell is not present.

In one embodiment, the selecting of whether the at least one memory cell storing the check bits is to be used to perform error checking and correction on a memory based on the defect information may include determining not to select a memory cell of the defective column arranged in the row in which the spare memory cell storing '1' is present, when '1' is stored in the spare memory cell of the information storing spare column.

In one embodiment, the selecting of whether the at least one memory cell storing the check bits is to be used to perform error checking and correction on a memory based on the defect information may include determining to select a memory cell of the defective column arranged in the row in which the spare memory cell storing '0 is present, when '0 is stored in the spare memory cell of the information storing spare column.

According to another aspect of the present invention, a method of improving an error checking and correction performance of a memory includes replacing a defective column including a defective memory cell of a memory cell array with a spare column of a spare cell array, wherein the memory cell array includes memory cells in a matrix, and the spare cell array includes spare memory cells in a matrix to be replaced for defective memory cells; storing check bits of error correction code in at least one memory cell of the defective column; storing defect information regarding the defective memory cell in a storage unit; selecting whether the at least one memory cell storing the check bits is to be used to perform error checking and correction on a memory, based on the defect information; and performing error checking and correction on the memory using a memory cell selected based on a result of selecting whether the at least one memory cell storing the check bits is to be used.

In one embodiment, the defect information may be address information of a defective row in which the defective memory cell is present. The defective row may be a row of the spare cell array in which the defective memory cell is present after the defective column is replaced with the spare column.

In one embodiment, the selecting of whether the at least one memory cell storing the check bits is to be used to perform error checking and correction on a memory based on the defect information may include determining not to select a memory cell of the defective column arranged in the defective row, the address information of which is stored in the storage unit.

In one embodiment, the storage unit may be divided into regions identifying the defective column.

In one embodiment, the regions may be divided from the storage unit, based on original arrangement states of the spare columns in the spare cell array before the spare columns are used to replace the defective column.

In one embodiment, the defect information may be stored in each of the regions of the storage unit.

In one embodiment, the selecting of whether the at least one memory cell storing the check bits is to be used to perform error checking and correction on a memory based on the defect information may include selecting a memory cell of the defective column arranged in a normal row, the address information of which is not stored in the storage unit.

In one embodiment, the selecting of whether the at least one memory cell storing the check bits is to be used to perform error checking and correction on a memory based on the defect information may include selecting a memory cell disposed between the memory cell array and the defective memory cell among memory cells of the defective column arranged in the defective row, the address information of which is stored in the storage unit.

In one embodiment, the storage unit may be a content addressable memory (CAM). The CAM is a special memory to be used in an exploration application that needs to be run at very high speeds, and is also referred to as an associative memory. The storage unit may be disposed outside the memory cell array and the spare cell array. A method of providing a separate storage unit and storing defect information therein will be described in detail below.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

The present invention may be embodied in many different forms and accomplished in various embodiments. Thus, exemplary embodiments of the present invention will be illustrated in the drawings and described in detail in the detailed description. However, the present invention is not limited to these exemplary embodiments, and it would be appreciated by those of ordinary skill in the art that changes may be made in these exemplary embodiments without departing from the principles and spirit of the invention, the scope of which is defined in the claims and their equivalents.

Hereinafter, exemplary embodiments of the present invention will be described in detail with reference to the accompanying drawings. The same reference numerals represent the same elements throughout the drawings.

Figure 2:
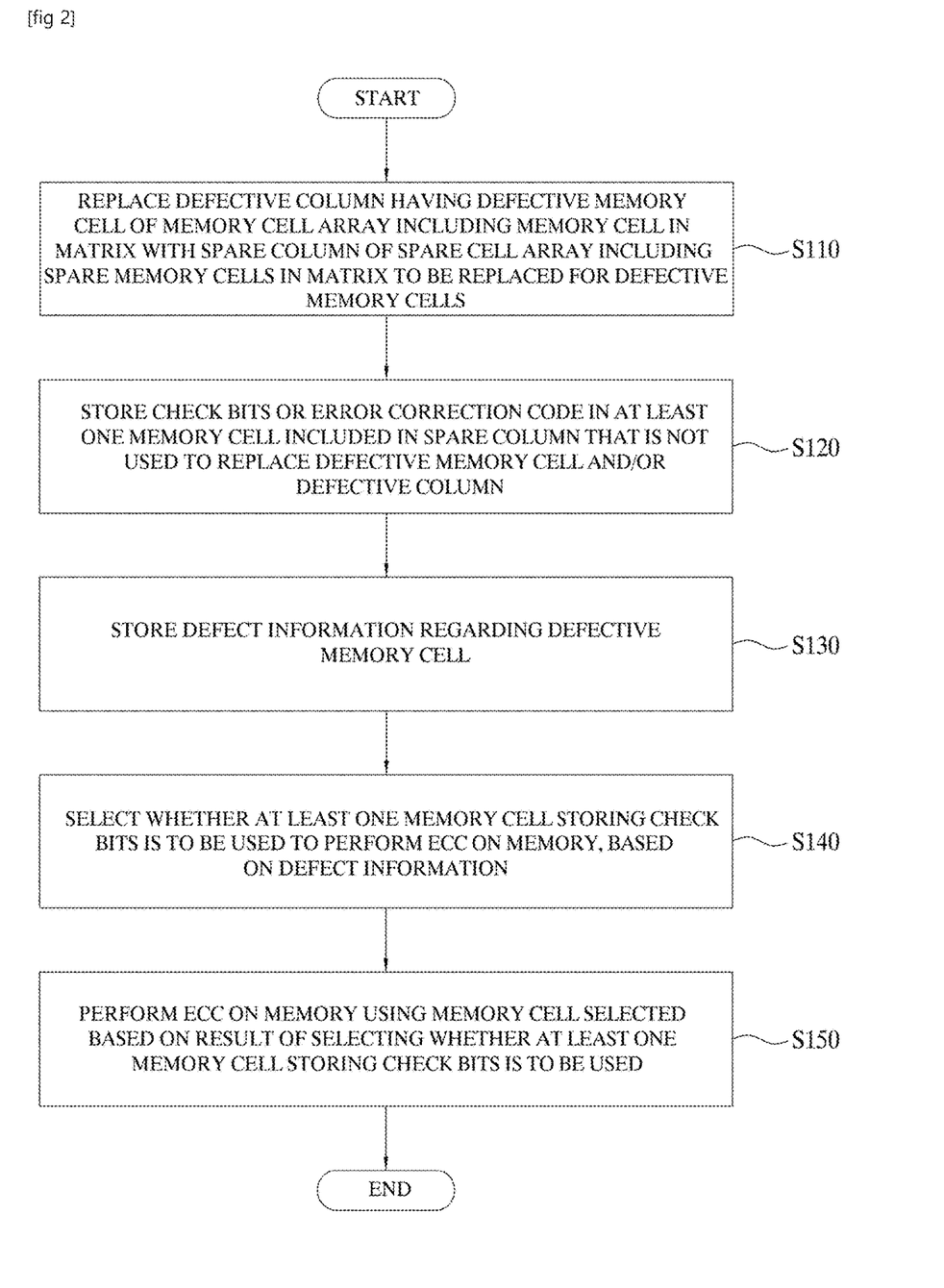
FIG. 2 is a flowchart of a method of improving an error checking and correction performance of a memory according to an exemplary embodiment of the present invention.

FIG. 2 is a flowchart of a method of improving an error checking and correction performance of a memory according to an exemplary embodiment of the present invention.

Referring to FIG. 2, the method of improving an error checking and correction performance of a memory according to an exemplary embodiment of the present invention may include replacing a defective column having a defective memory cell of a memory cell array including memory cells in a matrix with a spare column of a spare cell array including spare memory cells in a matrix to be replaced for defective memory cells (operation S110); storing check bits of error correction code in at least one memory cell of spare columns, which are not used to replace the defective memory cell and/or the defective column (operation S120); storing defect information regarding the defective memory cell (operation S130); selecting whether the at least one memory cell storing the check bits is to be used to perform error checking and correction (ECC) on a memory, based on the defect information (operation S140); and performing ECC on the memory using a memory cell selected based on a result of selecting whether the at least one memory cell storing the check bits is to be used (operation S150).

In order to improve an error checking and correction performance of the memory, a defective column having a defective memory cell of a memory cell array including memory cells in a matrix is replaced with a spare column of a space cell array including spare memory cells in a matrix to be replaced for defective memory cells of the memory cell array (operation S110). For example, the defective column may be replaced with the spare column by controlling a signal line connecting the defective column and the spare column to be 'on' or 'off'.

For example, the memory cell array including the memory cells in the matrix may have an M(row)×N(column) structure, and the spare cell array including the spare memory cells in the matrix may have an M(row)×L(column) structure.

The number of the rows of the memory cell array may be equal to that of the rows of the spare cell array, so that a defective column having a defective memory cell of the memory cell array may be replaced with a spare column of the spare cell array when a defect occurs in the memory cells of the memory cell array.

Next, check bits of error correction code are stored in at least one memory cell included in spare columns that are not used to replace the defective column and/or the defective column (operation S120). For example, not only the defective memory cell but also normal memory cells that may operate normally are present in the defective column, and thus the check bits of the error correction code are stored in the normal memory cells.

Also, all the spare columns that are not used to replace the defective memory cell include memory cells that may operate normally, and thus the check bits of the error correction code are stored in these memory cells.

Next, defect information regarding the defective memory cell is stored (operation S130). For example, the defect information may be information regarding the location of the defective memory cell in the defective column. The defect information may be stored in an information storing spare column which is not used to replace the defective column among the spare columns of the spare cell array.

For example, the defect information may be stored in the information storing spare column by storing '1' in a spare memory cell of the information storing spare column in a row in which the defective memory cell is present, when the defective memory cell is present, and storing '0' in a spare memory cell of the information storing spare column in a row in which the defective memory cell is not present, when the defective memory cell is not present.

For example, the information storing spare column may be a spare column farthest away from the memory cell array among spare columns arranged in the spare cell array. For example, the spare cell array may include a plurality of spare columns, and a spare column farthest away from the memory cell array may be the information storing spare column.

Information regarding the locations of defective memory cells in defective columns may be address information of respective defective rows of the spare cell array in which defective memory cells are present. Since such defect information includes the address information of the respective defective rows, the defective rows of the spare cell array in which the defective memory cells are present may be distinguished from normal rows in which no defective memory cells are present, and a state in which the defective rows are arranged in the spare cell array may be checked, based on this information.

Next, whether the at least one memory cell storing the check bits is to be used to perform ECC on the memory is selected based on the defect information (operation S140).

For example, when '1' is stored in a spare memory cell of the information storing spare column, a memory cell of the defective column arranged in a row in which the spare memory cell is present may not be selected. When '0' is stored in a spare memory cell of the information storing spare column, a memory cell of the defective column arranged in a row in which the spare memory cell storing '0' is present may be selected.

That is, when '0' is stored in a spare memory cell, all memory cells included in a defective column arranged in a row of the spare memory cell may be used to perform ECC. Through this process, memory cells included in the defective column may be used to perform ECC, thereby increasing a probability of successfully performing ECC.

When the defect information is stored in the information storing spare column among the spare columns of the spare cell array, the number of spare memory cells for storing the check bits of the error correction code may decrease. Thus, the defect information may be separately stored in a storage unit outside the spare cell array to store the check bits without decreasing the number of spare memory cells for storing the check bits, as will be described in detail with reference to FIG. 3 below.

Next, ECC is performed on the memory using a memory cell selected based on the result of selecting whether the at least one memory cell storing the check bits is to be used (operation S150).

Figure 3:
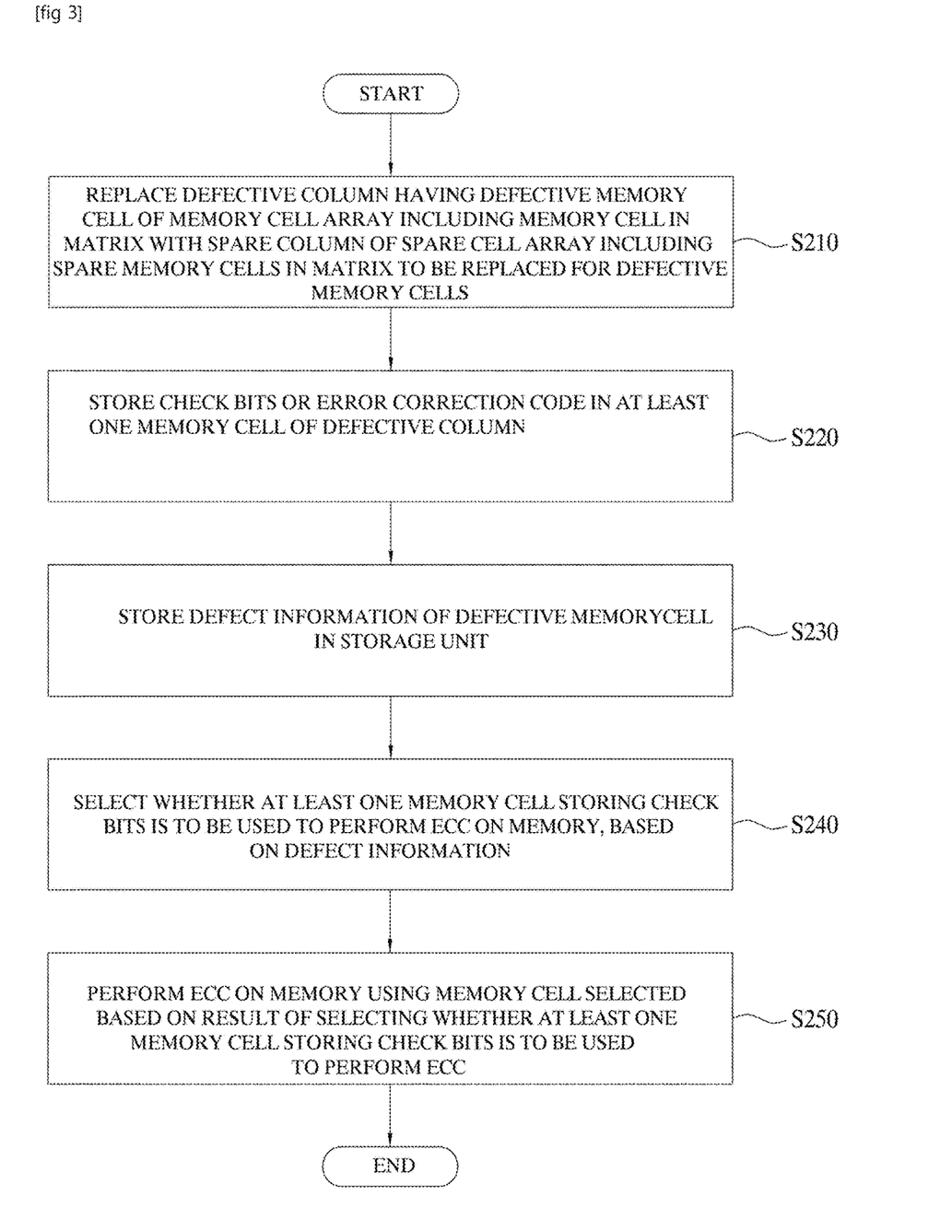
FIG. 3 is a flowchart of a method of improving an error checking and correction performance of a memory according to another exemplary embodiment of the present invention.

FIG. 3 is a flowchart of a method of improving an error checking and correction performance of a memory according to another exemplary embodiment of the present invention.

Referring to FIG. 3, the method of improving an error checking and correction performance of a memory according to another exemplary embodiment of the present invention may include replacing a defective column of a memory cell array including memory cells in a matrix with a spare column of a spare cell array including spare memory cells in a matrix to be replaced for defective memory cells (operation S210); storing check bits of error correction code in at least one memory cell of the defective column (operation S220); storing defect information regarding the defective memory cell in a storage unit (operation S230); selecting whether the at least one memory cell storing the check bits is to be used to perform ECC on a memory, based on the defect information (operation S240); and performing ECC on the memory using a memory cell selected based on a result of selecting whether the at least one memory cell storing the check bits is to be used to perform ECC (operation S250).

In order to improve the error checking and correction performance of the memory, a defective column having a defective memory cell of the memory cell array including memory cells in the matrix is replaced with a spare column of the spare cell array including spare memory cells in the matrix to be replaced for defective memory cells of the memory cell array (operation S210).

Next, check bits of error correction code are stored in at least one memory cell of the defective column (operation S220). Operations S210 and S220 are substantially the same as operations S110 and S120 described above and are thus not described in detail here.

Next, defect information regarding the defective memory cell is stored in a storage unit (operation S230).

For example, the defect information may be address information of a defective row in which the defective memory cell is present. The defective row may be a row of the spare cell array in which the defective memory cell is present after the defective column having the defective memory cell is replaced with the spare column. A plurality of defective rows of the spare cell array may be distinguished from each other, based on the address information of the defective rows.

The storage unit may store the defect information. For example, the storage unit may be a content addressable memory (CAM).

The storage unit may be divided into regions identifying defective columns of the spare cell array. The regions may be divided from the storage unit according to a state in which the spare columns are arranged in the spare cell array before the spare columns are used to replace defective columns. Also, the defect information may be stored in the regions of the storage unit.

Next, whether the at least one memory cell storing the check bits is to be used to perform ECC on a memory is selected based on the defect information (operation S240).

For example, the selecting of whether the at least one memory cell storing the check bits is to be used to perform ECC on the memory based on the defect information may be performed to use, in ECC, memory cells of the defective column arranged in normal rows, the address information of which is not stored in the storage unit.

Also, a memory cell disposed between the memory cell array and the defective memory cell among memory cells of the defective column arranged in the defective rows, the address information of which is stored in the storage unit may be selected to be used to perform ECC.

Operations S230 and S240 will be described in detail in an embodiment to be described below.

Next, ECC is performed on the memory using a memory cell selected based on the result of selecting whether the at least one memory storing the check bits is to be used (operation S250).

Example 1

Figure 4:
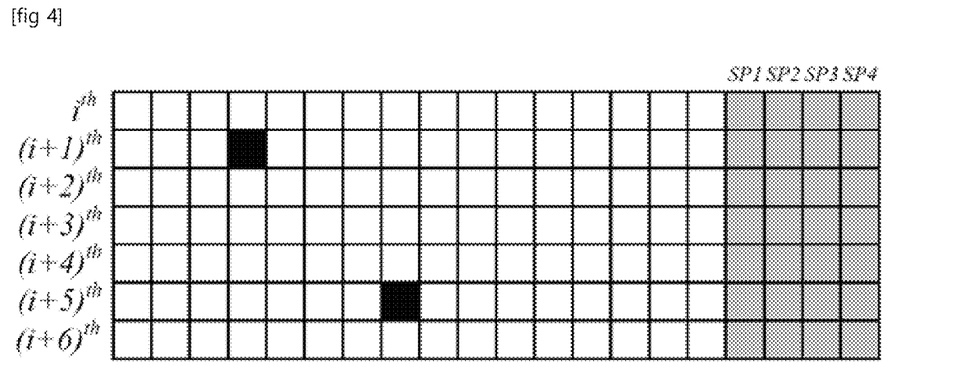
FIG. 4 illustrates the structure of a memory cell array having a defective memory cell, and the structure of a spare cell array including spare columns to be replaced for defective columns having a defective memory cell.
Figure 5:
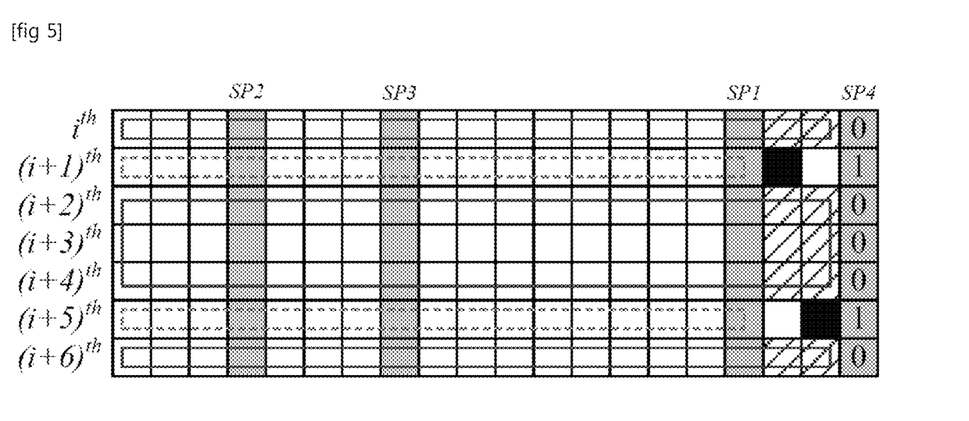
FIG. 5 is a diagram illustrating a method of selecting a memory cell storing check bits from the memory cell array and the spare cell array of FIG. 4 according to a method of improving an error checking and correction performance of a memory according to an exemplary embodiment of the present invention.

FIG. 4 illustrates the structure of a memory cell array having a defective memory cell, and the structure of a spare cell array including spare columns to be replaced for defective columns having a defective memory cell. FIG. 5 is a diagram illustrating a method of selecting a memory cell storing check bits from the memory cell array and the spare cell array of FIG. 4 according to a method of improving an error checking and correction performance of a memory according to an exemplary embodiment of the present invention.

In FIGS. 4 and 5, the memory cell array has a 16×7 matrix structure, and the spare cell array has a 4×7 matrix structure.

Referring to FIG. 4, "$i^{th}$" to "$(i+6)^{th}$" denote a plurality of pieces of address information respectively identifying seven rows of a memory cell array and a spare cell array, and "SP1" to "SP4" denote a plurality of pieces of address information respectively identifying four spare columns of the spare cell array.

A defect occurs in a fourth memory cell in an $(i+1)^{th}$ row and thus the fourth memory cell is displayed in black. A defect occurs in an eighth memory cell in an $(i+5)^{th}$ row and thus the eighth memory cell is displayed in black. Non-defective memory cells are displayed in white. Spare memory cells of the spare cell array are displayed in gray.

Referring to FIGS. 4 and 5, a defective column having the defective memory cell in the $(i+1)^{th}$ row is replaced with a spare column SP2 of the spare cell array, and a defective column having the defective memory cell in the $(i+5)^{th}$ row is replaced with a spare column SP3 of the spare cell array.

After the replacement, check bits of error correction code may be stored in at least one memory cell of a spare column SP1 that is not used to replace a defective memory cell and the defective columns. That is, the check bits of the error correction code may be stored in all of normal memory cells of the defective columns included in the spare cell array after the replacement and normal memory cells of the spare column SP1.

Since the check bits may be stored in each of the normal memory cells of the spare column SP1 and the defective columns in the $i^{th}$, $(i+2)^{th}$, $(i+3)^{th}$, $(i+4)^{th}$ and $(i+6)^{th}$ rows, three check bits may be stored in each of the $i^{th}$, $(i+2)^{th}$, $(i+3)^{th}$, $(i+4)^{th}$ and $(i+6)^{th}$ rows.

Defect information stored in spare memory cells of an information storing spare column may be information regarding the locations of the defective memory cells in the defective column. The defect information may be stored in the information storing spare column by storing '1' in a spare memory cell of the information storing spare column in a row in which a defective memory cell is present, when the defective memory cell is present, and storing '0' in a spare memory cell of the information storing spare column in a row in which a defective memory cell is not present when no defective memory cell is present.

The spare column SP4 serving as the information storing spare column of the spare cell array may be a spare column farthest away from the memory cell array among the spare columns arranged in the spare cell array.

Three memory cells storing the check bits in each of the $i^{th}$, $(i+2)^{th}$, $(i+3)^{th}$, $(i+4)^{th}$ and $(i+6)^{th}$ rows in which '0' is stored may be selected to be used to perform ECC. However, only memory cells storing the check bits of the spare column SP1 in the $(i+1)^{th}$ and $(i+5)^{th}$ rows in which '1' is stored may be selected to be used to perform ECC.

For example, when '1' is stored in a spare memory cell of the information storing spare column, memory cells of the defective columns arranged in a row in which the spare memory cell storing '1' is present are not selected. When '0' is stored in a spare memory cell of the information storing spare column, memory cells of the defective columns arranged in a row in which the spare memory cell storing '0' is present may be selected. Next, ECC is performed using the selected memory cells storing the check bits.

Example 2

Figure 6A:
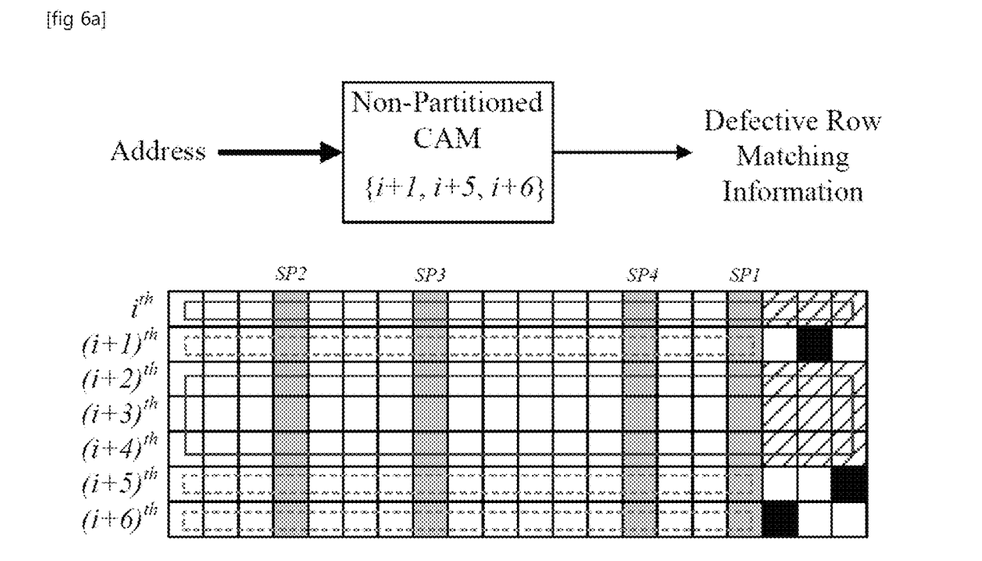
FIG. 6A is a diagram illustrating a method of selecting a memory cell storing check bits according to a method of improving an error checking and correction performance of a memory according to another exemplary embodiment of the present invention.

FIG. 6A is a diagram illustrating a method of selecting a memory cell storing check bits according to a method of improving an error checking and correction performance of a memory according to another exemplary embodiment of the present invention.

Referring to FIG. 6A, a defective column having a defective memory cell in an $(i+1)^{th}$ row is replaced with a spare column SP3 of a spare cell array, a defective column having a defective memory cell in an $(i+5)^{th}$ row is replaced with a spare column SP4 of the spare cell array, and a defective column having a defective memory cell in an $(i+6)^{th}$ row is replaced with a spare column SP2 of the spare cell array.

Areas of the spare memory cells for storing the check bits may decrease when defect information is stored in an information storing spare column among spare columns of the spare cell array as described above with reference to FIG. 5. Thus, in order to solve this problem, an additional storage unit may be used to store additional defect information. For example, a CAM may be used as the storage unit.

Address information of defective rows in which defective memory cells are present may be further stored in the storage unit. The defective rows may be rows in which defective memory cells included in the spare cell array are present after defective columns having defective memory cells are replaced with spare columns. A plurality of defective rows included in the spare cell array may be identified based on the address information of the defective rows.

Since defective memory cells are not present in the $i^{th}$, $(i+2)^{th}$, $(i+3)^{th}$ and $(i+4)^{th}$ rows, address information (which is defect information) of the $i^{th}$, $(i+2)^{th}$, $(i+3)^{th}$ and $(i+4)^{th}$ rows is not stored in the storage unit. Since defective memory cells are present in the $(i+1)^{th}$, $(i+5)^{th}$ and $(i+6)^{th}$ rows, address information (which is defect information) of the $(i+1)^{th}$, $(i+5)^{th}$ and $(i+6)^{th}$ rows may be stored in the storage unit.

Four memory cells may be selected in the $i^{th}$, $(i+2)^{th}$, $(i+3)^{th}$ and $(i+4)^{th}$ rows to be used to perform ECC, since check bits of error correction code is stored in a memory cell of a spare column SP1 and three memory cells of the defective columns in the $i^{th}$, $(i+2)^{th}$, $(i+3)^{th}$ and $(i+4)^{th}$ rows and defect information is not stored in the $i^{th}$, $(i+2)^{th}$, $(i+3)^{th}$ and $(i+4)^{th}$ rows.

However, since a plurality of pieces of defect information of the respective $(i+1)^{th}$, $(i+5)^{th}$ and $(i+6)^{th}$ rows are stored in the storage unit, only memory cells of the spare column SP1 may be selected to be used to perform ECC. Next, ECC is performed using the selected memory cells storing the check bits.

Example 3

Figure 6B:
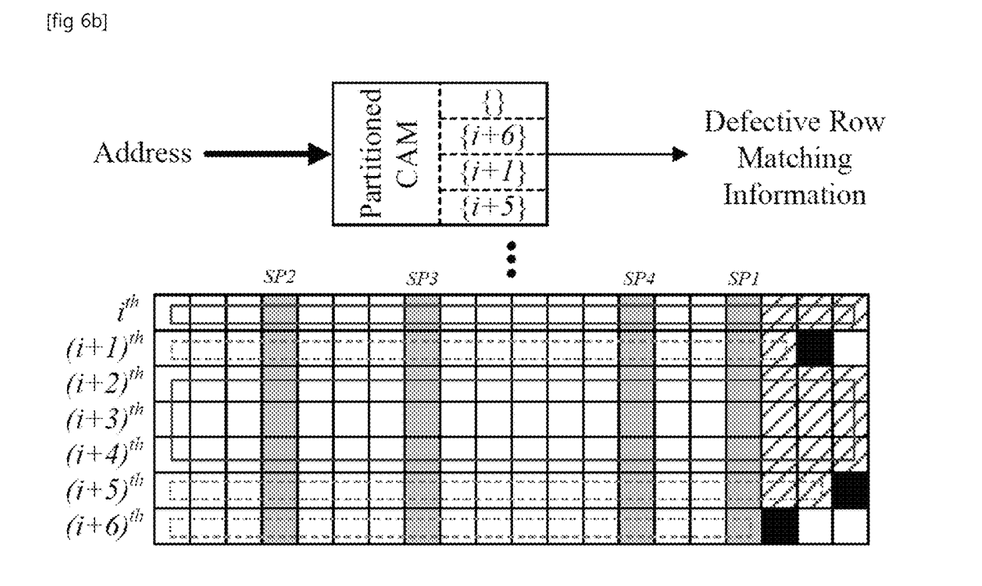
FIG. 6B is a diagram illustrating a method of selecting a memory cell storing check bits according to a method of improving an error checking and correction performance of a memory according to still another exemplary embodiment of the present invention.

FIG. 6B is a diagram illustrating a method of selecting a memory cell storing check bits according to a method of improving an error checking and correction performance of a memory according to still another exemplary embodiment of the present invention. A part of the method described above with reference to FIG. 6A that is substantially the same as the method of FIG. 6B is not described in detail here.

Referring to FIG. 6B, a defective column having a defective memory cell in an $(i+1)^{th}$ row is replaced with a spare column SP3 of a spare cell array, a defective column having a defective memory cell in an $(i+5)^{th}$ row is replaced with a spare column SP4 of the spare cell array, and a defective column having a defective memory cell in an $(i+6)^{th}$ row is replaced with a spare column SP2 of the spare cell array.

As described above with reference to FIG. 6A, an additional storage unit may be used to store defect information. For example, a CAM may be used as the storage unit.

The storage unit may be divided into regions identifying the defective columns of the spare cell array, and the regions may be divided from the storage unit according to a state in which the spare columns are arranged in the spare cell array before the spare columns are used to replace the defective columns.

The regions identifying the defective columns may be divided from the storage unit, based on the locations of the spare columns before the defective columns are replaced with spare columns. As illustrated in FIG. 6B, the storage unit may be divided into four regions indicated with dotted lines. The four regions denote the locations of the spare columns before the spare columns are replaced for the defective columns. The number of regions divided from the storage unit may be equal to the number of the spare columns of the spare cell array.

The spare column SP4 is disposed farthest from a memory cell array and may be thus defined to correspond to a lowermost region among the four regions. A spare column SP1 is disposed most adjacent to the memory cell array and may be thus defined to correspond to an uppermost region among the four regions. By defining the regions as described above, the locations of defective memory cells in defective rows in which the defective memory cells are present may be determined.

Also, since a defective row in which the defective memory cell of the defective column replaced with the spare column SP4 is present is the $(i+5)^{th}$ row, address information which is defect information of the $(i+5)^{th}$ row may be stored in the lowermost region among the four regions. In contrast, since the spare column SP1 is not used to replace a defective column, defect information may not be stored in the uppermost region of the storage unit. Through the above method, defective rows may be identified based on the defect information stored in each of the regions of the storage unit, and the locations of the defective memory cells in the defective rows may be determined.

In each of the $i^{th}$, $(i+2)^{th}$, $(i+3)^{th}$ and $(i+4)^{th}$ rows, the address information of which is not stored in the storage unit, a memory cell storing the check bits of the spare column SP1 that is not used to replace a defective column and three memory cells storing the check bits of the defective columns arranged in the $i^{th}$, $(i+2)^{th}$, $(i+3)^{th}$ and $(i+4)^{th}$ rows may be selected to be used to perform ECC.

In contrast, in the $(i+1)^{th}$ row in which the defective memory cell is present, one memory cell storing the check bits of the spare column SP1, and only a memory cell storing the check bits and disposed between the memory cell array and the defective memory cell in the $(i+1)^{th}$ row may be selected to be used to perform ECC.

In the $(i+5)^{th}$ row in which the defective memory cell is present, one memory cell storing the check bits of the spare column SP1, and only two memory cells storing the check bits and disposed between the memory cell array and the defective memory cell in the $(i+5)^{th}$ row may be selected to be used to perform ECC.

In the $(i+6)^{th}$ row in which the defective memory cell is present, only one memory cell storing the check bits of the spare column SP1 may be selected to be used to perform ECC. Next, ECC is performed using the selected memory cells storing the check bits.

When the above method is used, ECC may be performed in a state in which one memory cell storing the check bits of the defective column in the $(i+1)^{th}$ row is added and two memory cells storing the check bits of the defective column in the $(i+5)^{th}$ row are added, compared to the method described above with reference to FIG. 5A. In this case, the number of memory cells storing the check bits increases and thus a probability of successfully performing ECC may further increase.

Experimental Example

The following experiment was conducted to evaluate effects of a method of improving an error checking and correction performance of a memory according to an exemplary embodiment of the present invention.

For the experiment, a case in which triple-errors occurred, a case in which non-adjacent double-errors occurred, and a case in which random double-errors (non-adjacent double-errors or adjacent double-errors) occurred were assumed.

Tables 1 to 4 below show results of conducting the experiment using check bits '0' to '4' one hundred million times.

Table 1 below shows a miscorrection probability of SEC-DED code in which triple-errors occurred.

TABLE 1

| | Number of Check Bits | | | | |
|---|---|---|---|---|---|
| Word Size | 0 | 1 | 2 | 3 | 4 |
| 16-bit | 65.190% | 28.367% | 12.389% | 5.455% | 2.422% |
| 32-bit | 59.663% | 27.571% | 12.812% | 5.925% | 2.766% |
| 64-bit | 55.594% | 26.662% | 12.781% | 6.148% | 2.947% |

Table 2 below shows a miscorrection probability of SEC-DED-DAEC code in which triple-errors occurred.

TABLE 2

| | Number of Check Bits | | | | |
|---|---|---|---|---|---|
| Word Size | 0 | 1 | 2 | 3 | 4 |
| 16-bit | 65.178% | 33.497% | 16.319% | 7.934% | 3.839% |
| 32-bit | 59.655% | 30.374% | 15.032% | 7.421% | 3.649% |
| 64-bit | 55.567% | 28.110% | 14.007% | 6.989% | 3.472% |

Table 3 below shows a miscorrection probability of SEC-DED-DAEC code in which non-adjacent double-errors occurred.

TABLE 3

| | Number of Check Bits | | | | |
|---|---|---|---|---|---|
| Word Size | 0 | 1 | 2 | 3 | 4 |
| 16-bit | 64.300% | 29.293% | 13.359% | 6.127% | 2.807% |
| 32-bit | 57.351% | 27.201% | 12.921% | 6.151% | 2.917% |
| 64-bit | 54.564% | 26.519% | 12.913% | 6.277% | 3.054% |

Table 4 below shows a miscorrection probability of SEC-DED-DAEC code in which random double-errors occurred.

TABLE 4

| | Number of Check Bits | | | | |
|---|---|---|---|---|---|
| Word Size | 0 | 1 | 2 | 3 | 4 |
| 16-bit | 58.441% | 26.724% | 12.272% | 5.608% | 2.609% |

TABLE 4-continued

| | Number of Check Bits | | | | |
|---|---|---|---|---|---|
| Word Size | 0 | 1 | 2 | 3 | 4 |
| 32-bit | 54.391% | 25.803% | 12.267% | 5.856% | 2.775% |
| 64-bit | 53.042% | 25.767% | 12.573% | 6.117% | 2.978% |

In order to evaluate effects of a method of improving an error checking and correction performance of a memory according to an exemplary embodiment of the present invention, "$P_{clean}$" was defined. "$P_{clean}$" denotes a probability of perfectly performing ECC without causing errors when data is read from all memory cells.

Here, "$P_{mis}$" denotes a miscorrection probability that may be achieved from each of Tables 1 to 4 above, and "RER" denotes a row error rate that is a probability that a specific error may occur in rows of a memory cell array. For the experiment, the RERs of triple-errors and random double-errors were determined be each '0.001'.

"$P_{ne}$" means that no errors occur or all errors are corrected or tested when data is read and corrected in units of rows of the memory cell array, and may be expressed by Equation 1 below.

$$P_{ne}=1-P_{mis}\text{RER} \qquad \text{[Equation 1]}$$

Also, "$P_{clean}$" may be expressed by Equation 2 below.

$$P_{clean} = \prod_{k=1}^{N_{row}} P_{ne\_k}, \qquad \text{[Equation 2]}$$

wherein "$N_{row}$" denotes the number of rows of the memory cell array, and "$N_{repair}$" denotes the number of spare columns used to replace defective columns.

In order to calculate "$P_{clean}$", the following three cases were set on an assumption that the spare cell array includes four spare columns.

In case A, ECC was conducted according to the related art, Example 1, Example 2, and Example 3 in a state in which one spare column was used to replace a defective column and the other three spare columns were not used.

In Case B, ECC was conducted according to the related art, Example 1, Example 2, and Example 3 in a state in which two spare columns were used to replace defective columns and the other two spare columns were not used.

In Case C, ECC was conducted according to the related art, Example 1, Example 2, and Example 3 in a state in which three spare columns were used to replace defective columns and the other spare column was not used.

Triple-errors and random double-errors were generated in SEC-DED-DAEC code and then "$P_{clean}$" was calculated with respect to Cases A to C. Here, the rows of a memory were set to be 1K bits long and 8K bits long, and 16-bit words, 32-bit words, and 64-bit words were used.

Table 5 below shows results of calculating $P_{clean}$ when triple-errors occurred in Cases A to C.

TABLE 5

|  |  | 1K × 16 | 8K × 16 | 1K × 32 | 8K × 32 | 1K × 64 | 8K × 64 |
| --- | --- | --- | --- | --- | --- | --- | --- |
| Case A | Related art | 92.197% | 52.206% | 92.682% | 54.447% | 93.093% | 56.408% |
|  | Example 1 | 92.189% | 52.201% | 92.675% | 54.442% | 93.087% | 56.404% |
|  | Example 2 | 96.141% | 73.013% | 96.329% | 74.158% | 96.504% | 75.242% |
|  | Example 3 | 96.141% | 73.013% | 96.329% | 74.158% | 96.504% | 75.242% |
| Case B | Related art | 84.610% | 26.264% | 85.732% | 29.185% | 86.637% | 31.742% |
|  | Example 1 | 92.149% | 52.179% | 92.640% | 54.422% | 93.054% | 56.384% |
|  | Example 2 | 96.121% | 72.997% | 96.310% | 74.144% | 96.487% | 75.228% |
|  | Example 3 | 96.129% | 73.004% | 96.318% | 74.150% | 96.494% | 75.234% |
| Case C | Related art | 70.959% | 6.428% | 73.266% | 8.302% | 74.985% | 9.995% |
|  | Example 1 | 92.038% | 52.116% | 92.537% | 54.361% | 92.958% | 56.326% |
|  | Example 2 | 96.060% | 72.951% | 96.255% | 74.102% | 96.436% | 75.189% |
|  | Example 3 | 96.191% | 72.982% | 96.292% | 74.130% | 96.470% | 75.215% |

Table 6 below shows results of calculating $P_{clean}$ when random double-errors occurred in Cases A to C.

TABLE 6

|  |  | 1K × 16 | 8K × 16 | 1K × 32 | 8K × 32 | 1K × 64 | 8K × 64 |
| --- | --- | --- | --- | --- | --- | --- | --- |
| Case A | Related art | 94.419% | 63.165% | 94.180% | 61.895% | 93.928% | 60.585% |
|  | Example 1 | 94.413% | 63.161% | 94.174% | 61.891% | 93.922% | 60.581% |
|  | Example 2 | 97.361% | 80.754% | 97.195% | 79.663% | 96.993% | 78.349% |
|  | Example 3 | 97.361% | 80.754% | 97.195% | 79.663% | 96.993% | 78.349% |
| Case B | Related art | 88.190% | 36.590% | 88.195% | 36.605% | 87.919% | 35.699% |
|  | Example 1 | 94.379% | 63.138% | 94.142% | 61.870% | 93.891% | 60.561% |
|  | Example 2 | 97.345% | 80.741% | 97.180% | 79.651% | 96.978% | 78.337% |
|  | Example 3 | 97.351% | 80.746% | 97.186% | 79.656% | 96.984% | 78.342% |
| Case C | Related art | 76.057% | 11.197% | 76.778% | 12.075% | 76.806% | 12.110% |
|  | Example 1 | 94.269% | 63.065% | 94.042% | 61.804% | 93.796% | 60.500% |
|  | Example 2 | 97.293% | 80.698% | 97.131% | 79.611% | 96.930% | 78.298% |
|  | Example 3 | 97.328% | 80.727% | 97.164% | 79.637% | 96.962% | 78.324% |

Referring to Tables 5 and 6, the greater the capacity of the memory and the greater the size of words, the higher $P_{clean}$ in Examples 1 to 3.

In Example 1, the number of memory cells for storing check bits of error correction code was small since defect information was stored in one spare column and $P_{clean}$ was low since the number of memory cells storing the check bits to be used to perform ECC was small, compared to Examples 2 and 3.

Also, $P_{clean}$ in Example 3 was higher than $P_{clean}$ in Example 2. This is because a larger number of memory cells storing the check bits of the error correction code may be used to perform ECC in Example 3 than in Example 2.

As described above, according to the present invention, check bits may be additionally stored in a memory cell of a spare column that is not used to replace a defective column and/or a normal memory cell of the defective column replaced with a spare column, and these memory cells may be used to perform ECC.

Also, since the check bits may be additionally stored in the memory cell of the spare column that is not used to replace a defective column and/or the normal memory cell of the defective column replaced with the spare column and these memory cells may be used to perform ECC, an error checking and correction performance of a memory may be improved.

Also, whether a memory cell storing the check bits is to be used to perform ECC may be determined.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of improving an error checking and correction performance of a memory, the method comprising:
    replacing a defective column including a defective memory cell of a memory cell array with a spare column of a spare cell array, wherein the memory cell array comprises memory cells in a matrix, and the spare cell array comprises spare memory cells in a matrix to be replaced for defective memory cells;
    storing check bits of error correction code in a non-defective memory cell of the defective column, and further storing check bits of error correction code in a memory cell of another spare column of the spare cell array only if another spare column is available;
    storing defect information regarding the defective memory cell in an information storing spare column of the spare cell array;
    deciding whether a memory cell of the defective column is to be used to perform error checking and correction on a memory, based on the defect information stored in the information storing spare column; and
    performing error checking and correction using the memory cell decided based on a result of the deciding step.

2. The method of claim 1, wherein the defect information is information regarding a location of the defective memory cell in the defective column.

3. The method of claim 2, wherein the storing of the defect information in the information storing spare column comprises storing '1' in a spare memory cell of the information storing spare column arranged in a row in which the defective memory cell is present when the defective memory cell is present, and otherwise storing '0' in the spare memory cell of the information storing spare column.

4. The method of claim 3, wherein the deciding comprises excluding from use for error checking and correction a memory cell of the defective column arranged in the row in which the spare memory cell storing '1' is present, when '1' is stored in the spare memory cell of the information storing spare column.

5. The method of claim 3, wherein the deciding comprises determining to select a memory cell of the defective column arranged in the row in which the spare memory cell storing '0 is present, when '0 is stored in the spare memory cell of the information storing spare column.

6. A method of improving an error checking and correction performance of a memory, the method comprising:
replacing a defective column including a defective memory cell of a memory cell array with a spare column of a spare cell array, wherein the memory cell array comprises memory cells in a matrix, and the spare cell array comprises spare memory cells in a matrix to be replaced for defective memory cells;
storing check bits of error correction code in at least one memory cell of the defective column;
storing defect information regarding the defective memory cell in a storage unit;
selecting whether the at least one non-defective memory cell storing the check bits is to be used to perform error checking and correction on a memory, based on the defect information; and
performing error checking and correction on the memory using a memory cell selected based on a result of selecting whether the at least one non-defective memory cell storing the check bits is to be used.

7. The method of claim 6, wherein the defect information is address information of a defective row in which the defective memory cell is present.

8. The method of claim 7, wherein the selecting of whether the at least one non-defective memory cell storing the check bits is to be used to perform error checking and correction on a memory based on the defect information comprises excluding from use for error checking and correction a memory cell of the defective column arranged in the defective row, the address information of which is stored in the storage unit.

9. The method of claim 7, wherein the storage unit is divided into regions identifying the defective column.

10. The method of claim 9, wherein the regions are divided from the storage unit, based on an original arrangement state of the spare column in the spare cell array before the spare column is used to replace the defective column.

11. The method of claim 10, wherein the defect information is capable of being stored in each of the regions of the storage unit.

12. The method of claim 11, wherein the selecting of whether the at least one non-defective memory cell storing the check bits is to be used to perform error checking and correction on a memory based on the defect information comprises selecting a memory cell of the defective column arranged in a normal row, the storage unit being free of the address information of the memory cell of the defective column arranged in the normal row.

13. The method of claim 12, wherein the selecting of whether the at least one non-defective memory cell storing the check bits is to be used to perform error checking and correction on a memory based on the defect information comprises selecting a memory cell disposed between the memory cell array and the defective memory cell among memory cells of the defective column arranged in the defective row, the address information of which is stored in the storage unit.

14. The method of claim 6, wherein the storage unit is a content addressable memory (CAM).

15. A method of improving error checking and correction in a memory, the method comprising:
replacing, in a memory cell array of memory cells in a matrix, a column containing a defective memory cell (DMC) with a spare column—free of any DMCs—of a spare cell array (SCA) of spare memory cells in a matrix;
storing check bits of error correction code in a memory cell of any spare column that remains in the SCA after the replacing, only if any spare column remains in the SCA after the replacing;
storing check bits of error correction code in a non-defective memory cell of a column containing any DMC that has replaced any spare column of the SCA;
storing defect information regarding a location of the DMC within the replaced defective column in an information storing spare column (ISSC) of the SCA, wherein the ISSC is designated to remain in the SCA;
selecting, based on the defect information, whether to use at least one memory cell for performing error checking and correction in the memory; and
performing error checking and correction in the memory based on the selecting.

16. The method of claim 15, wherein the storing the defect information comprises storing '1' in a spare memory cell of the ISSC arranged in a row in which any DMC is present in order to exclude from use the corresponding DMC for error checking and correction, and storing '0' in a spare memory cell of the ISSC arranged in a row in which no DMC is present in order to select for use the corresponding non-defective memory cell for error checking and correction.

* * * * *